US011635838B1

(12) United States Patent
Chuang et al.

(10) Patent No.: US 11,635,838 B1
(45) Date of Patent: Apr. 25, 2023

(54) TOUCH DISPLAY DEVICE

(71) Applicant: HANNSTAR DISPLAY CORPORATION, Taipei (TW)

(72) Inventors: Yao-Chih Chuang, Tainan (TW); Chia-Yu Liu, Tainan (TW); Chih-Wei Chen, Tainan (TW); Ming-Liang Chen, Tainan (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 0 days.

(21) Appl. No.: 17/958,439

(22) Filed: Oct. 3, 2022

(30) Foreign Application Priority Data

Oct. 22, 2021 (CN) .......................... 202111234903.2

(51) Int. Cl.
*G06F 3/041* (2006.01)
*H01L 25/075* (2006.01)
*G06F 3/044* (2006.01)
*H01L 33/60* (2010.01)

(52) U.S. Cl.
CPC .......... *G06F 3/0412* (2013.01); *G06F 3/0443* (2019.05); *G06F 3/0445* (2019.05); *H01L 25/0753* (2013.01); *H01L 33/60* (2013.01); *G06F 2203/04112* (2013.01)

(58) Field of Classification Search
None
See application file for complete search history.

(56) References Cited

U.S. PATENT DOCUMENTS

2016/0282987 A1* 9/2016 Choi ...................... G06F 3/0446
2016/0320885 A1* 11/2016 Kim ...................... G06F 3/0445

* cited by examiner

*Primary Examiner* — Nicholas J Lee
(74) *Attorney, Agent, or Firm* — Winston Hsu

(57) ABSTRACT

A touch display device including a substrate, a touch structure, a plurality of light emitting elements and a reflection layer is provided by the present invention. The substrate includes a first surface and a second surface opposite to the first surface. The touch structure includes a plurality of first touch electrodes disposed on the first surface of the substrate. The light emitting elements are disposed on the second surface of the substrate, and one of the light emitting elements includes a light emitting surface and a bottom surface opposite to the light emitting surface. The reflection layer is disposed on the second surface of the substrate. The light emitting elements are disposed between the reflection layer and the substrate, and the light emitting surface of one of the light emitting elements is disposed between the bottom surface and the reflection layer.

16 Claims, 2 Drawing Sheets

TOUCH DISPLAY DEVICE

BACKGROUND OF THE INVENTION

1. Field of the Invention

The present invention relates to a touch display device, and more particularly to a touch display device in which the touch structure and the light emitting elements are respectively disposed on two opposite surfaces of the substrate.

2. Description of the Prior Art

In various kinds of electronic products, display screens have been widely used with touch components to form touch display devices, such that the users may directly communicate with the electronic products, and conventional input devices such as the keyboard or the mouse may be replaced to reduce the size of the electronic product and improve the convenience of human-machine communication. In the field of touch display devices, to reduce the thickness of the products and improve the production yield have become one of the important issues.

SUMMARY OF THE INVENTION

The technical problem to be solved in the present invention is to reduce the thickness of the touch display device and improve the production yield.

In order to solve the above-mentioned technical problem, a touch display device including a substrate, a touch structure, a plurality of light emitting elements and a reflection layer is provided by the present invention. The substrate includes a first surface and a second surface opposite to the first surface. The touch structure includes a plurality of first touch electrodes disposed on the first surface of the substrate. The light emitting elements are disposed on the second surface of the substrate, and one of the light emitting elements includes a light emitting surface and a bottom surface opposite to the light emitting surface. The reflection layer is disposed on the second surface of the substrate. The light emitting elements are disposed between the reflection layer and the substrate, and the light emitting surface of one of the light emitting elements is disposed between the bottom surface and the reflection layer.

In the touch display device of the present invention, the light emitting elements and the touch structure can respectively be disposed on two opposite surfaces of the substrate, such that the thickness of the touch display device can be reduced and the adhering process can be omitted, thereby reducing the cost and improving the production yield. Furthermore, in the manufacturing process of the touch display device, when a structure on the first surface or the second surface of the substrate is poor, the poor structure can be easily reworked, such that the production efficiency can be improved. In addition, although the light emitting elements are disposed at the back side of the touch display device, the light of the light emitting elements can still be guided to the front side of the touch display device through a reflection layer, such that the users can see the images from the front side of the touch display device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
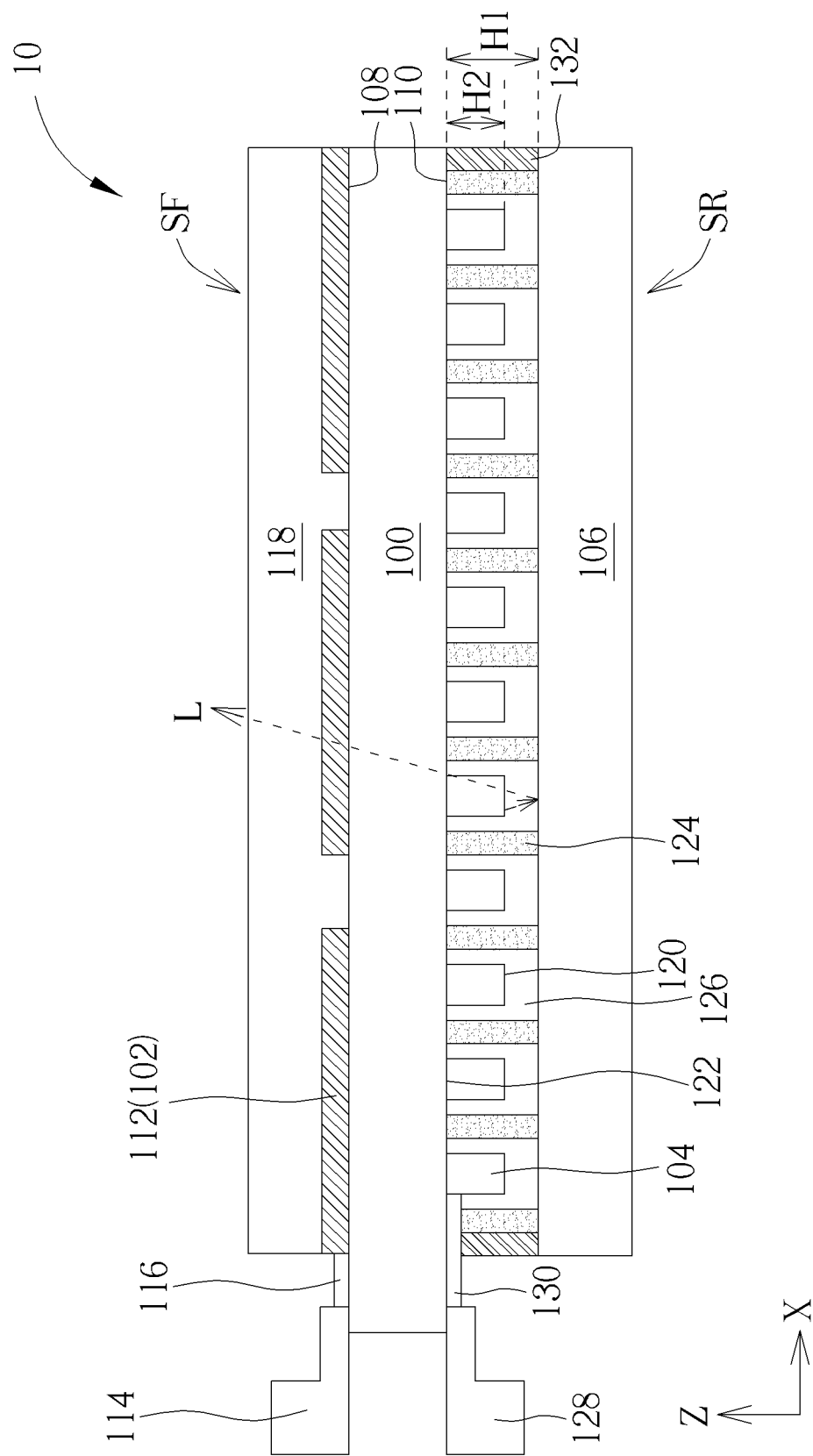
FIG. 1 schematically illustrates a cross-sectional view of a touch display device according to a first embodiment of the present invention.

In order to enable those skilled in the art to further understand the present invention, the preferred embodiments of the present invention are specifically described below, taken in junction with the drawings to detail the contents and the desired effects of the present invention. It should be noted that the drawings are simplified schematic diagrams, and only the components and combinations related to the present invention are shown to provide a clearer description of the basic structure or implementation method of the present invention, and the actual components and layout may be more complex. In addition, for ease of explanation, the numbers, shapes and sizes of the components shown in the drawings of the present invention may not be drawn proportionally according to actual conditions in implementation, and the details can be adjusted according to design requirements.

A direction X and a direction Z are labeled in the following figures. The direction Z may be perpendicular to the first surface 108 or the second surface 110 of the substrate 100, the direction X may be parallel to the first surface 108 or the second surface 110 of the substrate 100, and the direction Z may be perpendicular to the direction X. The spatial relationship of the structure can be described according to the direction X and the direction Z in the following figures.

Referring to FIG. 1, FIG. 1 schematically illustrates a cross-sectional view of a touch display device according to a first embodiment of the present invention. The touch display device 10 includes a substrate 100, a touch structure 102, a plurality of light emitting elements 104 and a reflection layer 106. The substrate 100 includes a material of high transmittance, but not limited thereto. For example, the substrate 100 may be a rigid substrate such as glass substrate, plastic substrate, quartz substrate or sapphire substrate, or a flexible substrate including polyimide (PI) or polyethylene terephthalate (PET), but not limited thereto. As shown in FIG. 1, the substrate 100 includes a first surface 108 and a second surface 110 opposite to the first surface 108.

The touch structure 102 may be a capacitive touch structure, but not limited thereto. The touch structure 102 may be self-capacitance, mutual-capacitance or other suitable kinds of touch structure, but not limited thereto. In the present embodiment, the touch structure 102 includes a plurality of first touch electrodes 112 disposed on the first surface 108 of the substrate 100, and the first touch electrodes 112 may include a plurality of patterned transparent electrodes or a plurality of metal mesh electrodes, but not limited thereto.

The touch display device 10 may further include a first circuit element 114 disposed on the first surface 108 of the substrate 100, and the first circuit element 114 is electrically connected to the touch structure 102. For example, as shown in FIG. 1, one of the first touch electrodes 112 may be electrically connected to the first circuit element 114 through a wire 116, and the wire 116 may be disposed on the first surface 108 of the substrate 100, but not limited thereto. Actually, a plurality of wires 116 may be disposed on the first surface 108 of the substrate 100, and each of the first touch electrodes 112 may be electrically connected to the first circuit element 114 through the corresponding wire 116. The first circuit element 114 may include a flexible printed circuit board, but not limited thereto. In some other embodiments, the first circuit element 114 may be a driving chip disposed on the substrate 100. In addition, the touch display device 10 may further include a protection layer 118 disposed on the first touch electrodes 112 of the touch structure 102, and the first touch electrodes 112 of the touch structure 102 are disposed between the protection layer 118 and the first surface 108 of the substrate 100. The protection layer 118 includes an insulating material with high transmittance, but not limited thereto.

The light emitting elements 104 are disposed on the second surface 110 of the substrate 100, and one of the light emitting elements 104 (or each of the light emitting elements 104) includes a light emitting surface 120 and a bottom surface 122 opposite to the light emitting surface 120. The light emitting surface 120 is farther away from the substrate 100 than the bottom surface 122, and the light emitting elements 104 may emit light toward a direction away from the substrate 100. The light emitting elements 104 may include a plurality of light emitting diode (LED) or a plurality of organic light emitting diode (OLED), and the light emitting diode may include mini light emitting diode (mini LED) or micro light emitting diode (micro LED), but not limited thereto.

The reflection layer 106 is disposed on the second surface 110 of the substrate 100, and the light emitting elements 104 are disposed between the reflection layer 106 and the second surface 110 of the substrate 100. In addition, the light emitting surface 120 of at least one light emitting element 104 is disposed between the bottom surface 122 and the reflection layer 106. The reflection layer 106 may include a material with a refractive index greater than or equal to 1.5. The material of the reflection layer 106 may include metal or coating layer with high reflectivity, but not limited thereto.

The touch display device 10 may further include a plurality of partition walls 124 disposed between the reflection layer 106 and the second surface 110 of the substrate 100, and one of the light emitting elements 104 is disposed between adjacent two of the partition walls 124, or adjacent two of the light emitting elements 104 can be spaced apart through a partition wall 124. For example, each of the light emitting elements 104 may serve as a sub-pixel, and the partition walls 124 may prevent the lights emitted from adjacent light emitting elements 104 from interfering with each other, thereby improving the display quality. The partition walls 124 include a light-absorbing material or a reflective material, but not limited thereto. For example, the partition wall 124 may include a black matrix or a metal layer, but not limited thereto.

The height H1 of the partition wall 124 may be greater than the height H2 of the light emitting element 104. For example, a ratio of the height H1 of the partition walls 124 to the height H2 of the light emitting elements 104 is greater than or equal to 1.2 (that is, $H1 \geq 1.2*H2$) to ensure sufficient allowance of disposition of each of the light emitting elements 104. Therefore, the touch display device 10 may include a gap 126 disposed between the reflection layer 106 and the light emitting surface 120 of one of the light emitting elements 104, or a gap 126 maybe included between the light emitting surface 120 of each of the light emitting elements 104 and the reflection layer 106.

In addition, the touch display device 10 may further include an insulating material with high transmittance or an air layer disposed in the gap 126, but not limited thereto. In some embodiments, when the insulating material is filled in the gap 126, a metal layer or a coating layer with high reflectivity may be formed on the insulating material and the partition walls 124 through a coating process to serve as the reflection layer 106, but not limited thereto. In some embodiments, the reflection layer 106 may include a metal plate or a metal sheet, and the reflection layer 106 may be adhered (for example, through a sealant 132) to a side of the partition wall 124 away from the substrate 100, such that the air layer maybe formed in the gap 126, but not limited thereto. In some other embodiments, the reflection layer 106 may include a sheet covering the light emitting surface 120, and a coating layer including particles of high reflectivity can be included in a side of the reflection layer 106 opposite to the light emitting surface 120.

Taking the light L in FIG. 1 as an example, the light L can be emitted from the light emitting surface 120 of the light emitting element 104 toward the reflection layer 106 at first, and then, the light L can be reflected by the reflection layer 106 after passing through the gap 126 and travels toward the substrate 100. After that, the light L passes through the second surface 110 and the first surface 108 of the substrate 100 in sequence. Finally, the light L exits the touch display device 10 from the side of the protection layer 118 away from the substrate 100. The light path mentioned above is just an example of the light paths in the touch display device 10, and the light path in the touch display device 10 is not limited thereto.

The touch display device 10 may further include a second circuit element 128 disposed on the second surface 110 of the substrate 100, and the second circuit element 128 is electrically connected to the light emitting elements 104. For example, as shown in FIG. 1, one of the light emitting elements 104 can be electrically connected to the second circuit element 128 through a wire 130, and the wire 130 can be disposed on the second surface 110 of the substrate 100, but not limited thereto. Actually, a plurality of wires 130 can be disposed on the second surface 110 of the substrate 100, and each of the light emitting elements 104 can be electrically connected to the second circuit element 128 through the corresponding wire 130. The second circuit element 128 may include a flexible printed circuit board, but not limited thereto. In some other embodiments, the second circuit element 128 may be a driving chip disposed on the substrate 100. In addition, the touch display device 10 may further include a sealant 132 disposed between the reflection layer 106 and the substrate 100 and on a periphery of the substrate 100.

In conventional touch display devices, the touch module is adhered to the display panel. Therefore, an adhering process is necessary, and the thickness of the display device cannot be reduced easily. In the touch display device 10 of the present invention, the light emitting elements 104 and the touch structure 102 can be disposed on two opposite surfaces of the substrate 100. Therefore, the thickness of the touch display device 100 can be reduced, and the adhering process can be omitted, thereby reducing the cost and improving the production yield. In addition, in the manufacturing process of the touch display device 10, when a structure on the first surface 108 or the second surface 110 of the substrate 100 is imperfect, the structure can be easily reworked, such that the production efficiency can be improved.

In addition, although the light emitting elements 104 are disposed at the back side SR (that is, the second surface 110 of the substrate 100) of the touch display device 10, the light of the light emitting elements 104 can still be guided to the front side SF of the touch display device 10 through the reflection layer 106, such that the users can see the images from the front side SF of the touch display device 10.

The touch display device of the present invention is not limited to the above-mention embodiment. Other embodiments of the present invention will be described in the following. In order to simplify the description and highlight the differences between the embodiments, the same elements in the following embodiments would be labeled with the same symbol, and the repeated features will not be redundantly described.

Figure 2:
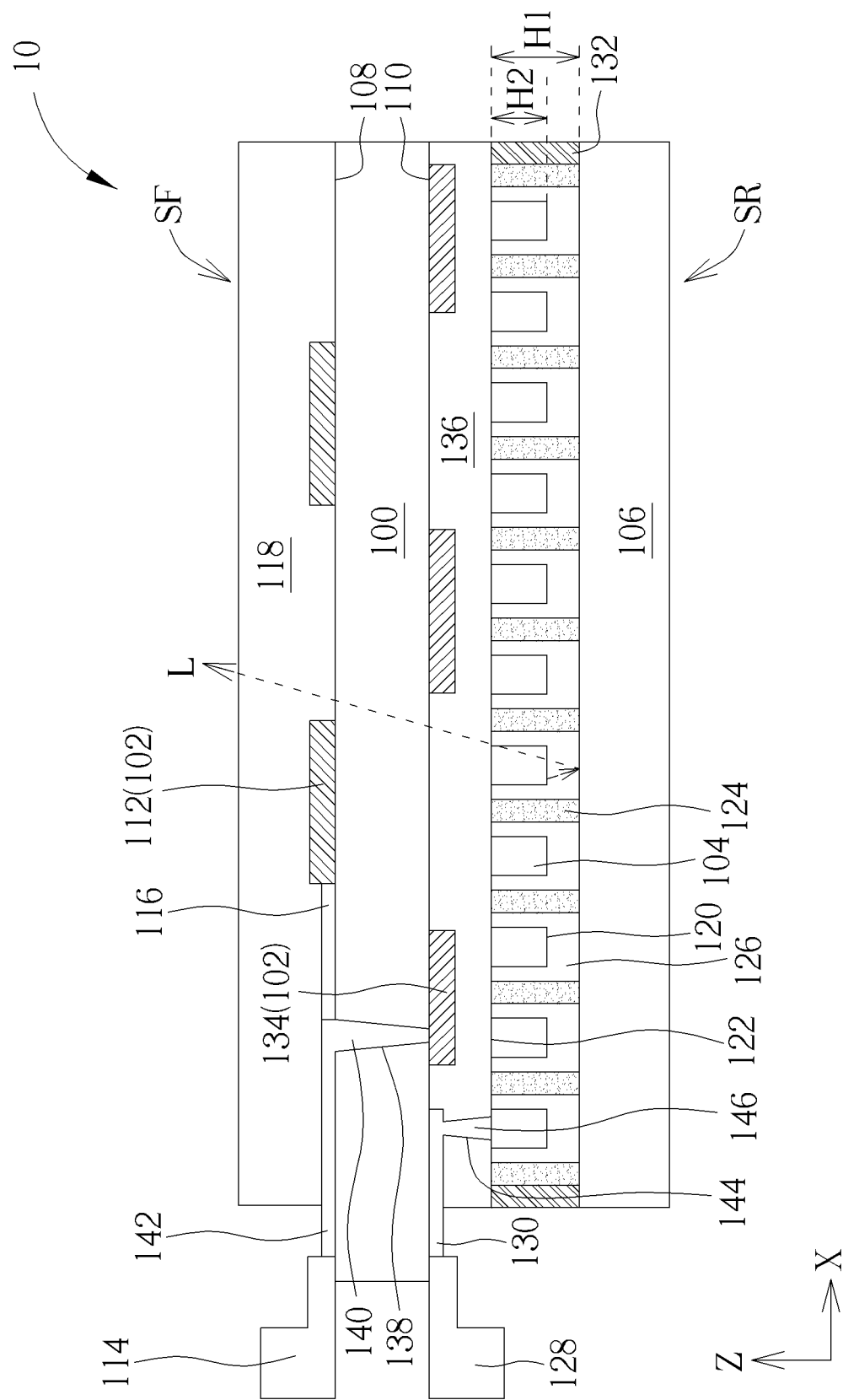
FIG. 2 schematically illustrates a cross-sectional view of a touch display device according to a second embodiment of the present invention.

Referring to FIG. 2, FIG. 2 schematically illustrates a cross-sectional view of a touch display device according to a second embodiment of the present invention. Different from the first embodiment, the touch structure 102 of the present embodiment may further include a plurality of second touch electrodes 134 disposed on the second surface 110 of the substrate 100, the second touch electrodes 134 are disposed between the light emitting elements 104 and the substrate 100, and the second touch electrodes 134 may include a plurality of patterned transparent electrodes or a plurality of metal mesh electrodes, but not limited thereto.

The touch structure 102 may further include at least one through hole 138 penetrating through the substrate 100, and a contact element 140 can be disposed in the through hole 138, wherein the first circuit element 114 and one of the second touch electrodes 134 are electrically connected to each other through the contact element 140. As shown in FIG. 2, one of the second touch electrodes 134 can be electrically connected to the first circuit element 114 through the contact element 140 and a wire 142, and the wire 142 can be disposed on the first surface 108 of the substrate 100, but not limited thereto. Actually, a plurality of wires 142 can be disposed on the first surface 108 of the substrate 100 and a plurality of contact elements 140 can be included in the substrate 100, and each of the second touch electrodes 134 can be electrically connected to the first circuit element 114 through the corresponding contact element 140 and the corresponding wire 142. In addition, each of the first touch electrodes 112 can be electrically connected to the first circuit element 114 through the corresponding wire 116 on the first surface 108 of the substrate 100.

The touch display device 10 may further include an insulating layer 136 disposed between the second touch electrodes 134 and the light emitting elements 104, and the insulating layer 136 may include an insulating material with high transmittance, but not limited thereto. The touch structure 102 may further include at least one through hole 144 penetrating through the insulating layer 136, and a contact element 146 can be disposed in the through hole 144. As shown in FIG. 2, one of the light emitting elements 104 can be electrically connected to the second circuit element 128 through the contact element 146 and the wire 130, but not limited thereto. In some other embodiments, the second circuit element 128 may be a driving chip disposed on the substrate 100. Actually, a plurality of wires 130 can be disposed on the second surface 110 of the substrate 100 and a plurality of contact elements 146 may be included in the insulating layer 136, and each of the light emitting elements 104 can be electrically connected to the second circuit element 128 through the corresponding contact element 146 and the corresponding wire 130.

In the touch display device of the present invention, the light emitting elements and the touch structure can be disposed on two opposite surfaces of the substrate. Therefore, the thickness of the touch display device can be reduced, and the adhering process can be omitted, thereby reducing the cost and improving the production yield. In addition, in the manufacturing process of the touch display device, when a structure on the first surface or the second surface of the substrate is poor, the poor structure can be easily reworked, such that the production efficiency can be improved. Moreover, although the light emitting elements are disposed at the back side of the touch display device, the light of the light emitting elements can still be guided to the front side of the touch display device through a reflection layer, such that the users can see the images from the front side of the touch display device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch display device, comprising:
   a substrate including a first surface and a second surface opposite to the first surface;
   a touch structure including a plurality of first touch electrodes disposed on the first surface of the substrate;
   a plurality of light emitting elements disposed on the second surface of the substrate, wherein one of the light emitting elements includes a light emitting surface and a bottom surface opposite to the light emitting surface; and
   a reflection layer disposed on the second surface of the substrate, wherein the light emitting elements are disposed between the reflection layer and the substrate, and the light emitting surface of the one of the light emitting elements is disposed between the bottom surface and the reflection layer.

2. The touch display device of claim 1, further comprising a gap disposed between the reflection layer and the light emitting surface of the one of the light emitting elements.

3. The touch display device of claim 2, further comprising an insulating layer or an air layer disposed in the gap.

4. The touch display device of claim 1, further comprising a plurality of partition walls disposed between the reflection layer and the substrate, wherein the one of the light emitting elements is disposed between adjacent two of the partition walls.

5. The touch display device of claim 4, wherein a ratio of a height of the partition walls to a height of the light emitting elements is greater than or equal to 1.2.

6. The touch display device of claim 4, wherein the partition walls include a light-absorbing material or a reflective material.

7. The touch display device of claim 1, wherein the light emitting elements include a plurality of mini light emitting diodes, a plurality of micro light emitting diodes or a plurality of organic light emitting diodes.

8. The touch display device of claim 1, wherein the first touch electrodes include a plurality of patterned transparent electrodes or a plurality of metal mesh electrodes.

9. The touch display device of claim 1, further comprising a sealant disposed between the reflection layer and the substrate and on a periphery of the substrate.

10. The touch display device of claim 1, further comprising a protection layer disposed on the first touch electrodes of the touch structure, wherein the first touch electrodes of the touch structure are disposed between the protection layer and the substrate.

11. The touch display device of claim 1, further comprising a first circuit element disposed on the first surface of the substrate, wherein the first circuit element is electrically connected to the touch structure.

12. The touch display device of claim 1, further comprising a second circuit element disposed on the second surface of the substrate, wherein the second circuit element is electrically connected to the light emitting elements.

13. The touch display device of claim 1, wherein the touch structure further includes a plurality of second touch electrodes disposed on the second surface of the substrate, and the second touch electrodes are disposed between the light emitting elements and the substrate.

14. The touch display device of claim 13, further comprising a first circuit element disposed on the first surface of the substrate, wherein the touch structure further comprises at least one through hole penetrating through the substrate, a contact element is disposed in the at least one through hole, and the first circuit element and one of the second touch electrodes are electrically connected to each other through the contact element.

15. The touch display device of claim 13, wherein the second touch electrodes include a plurality of patterned transparent electrodes or a plurality of metal mesh electrodes.

16. The touch display device of claim 1, wherein the reflection layer includes a material with a refractive index greater than or equal to 1.5.

* * * * *